(12) United States Patent
Pham

(10) Patent No.: US 6,355,514 B1
(45) Date of Patent: Mar. 12, 2002

(54) DUAL BIT ISOLATION SCHEME FOR FLASH DEVICES

(75) Inventor: Tuan Pham, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/597,358

(22) Filed: Jun. 19, 2000

Related U.S. Application Data

(60) Provisional application No. 60/181,591, filed on Feb. 10, 2000.

(51) Int. Cl.[7] .................. H01L 21/8247; H01L 21/70; H01L 21/77; H01L 21/82
(52) U.S. Cl. .................. 438/211; 257/315; 257/314
(58) Field of Search ................ 438/211, 197; 257/314, 315

(56) References Cited

U.S. PATENT DOCUMENTS

| | | | |
|---|---|---|---|
| 5,371,031 A | * 12/1994 | Gill et al. | .................... 438/264 |
| 6,166,409 A | * 12/2000 | Ratnam et al. | ............. 257/316 |
| 6,204,530 B1 | * 3/2001 | Choi | ........................ 257/315 |

FOREIGN PATENT DOCUMENTS

| WO | WO 99/07000 | 2/1999 |
|---|---|---|

* cited by examiner

*Primary Examiner*—Richard Elms
*Assistant Examiner*—Beth E. Owens
(74) *Attorney, Agent, or Firm*—Amin & Turocy, LLP

(57) ABSTRACT

The present invention relates generally to semiconductor memory devices and more particularly to multi-bit flash electrically erasable programmable read only memory (EEPROM) devices that employ charge trapping within a floating gate to indicate a 0 or 1 bit state. A memory device is provided, according to an aspect of the invention, comprising a floating gate transistor having dual ONO floating gates with an isolation spacer between floating gates. Processes for making the memory device according to the invention are also provided.

14 Claims, 2 Drawing Sheets

DUAL BIT ISOLATION SCHEME FOR FLASH DEVICES

RELATED APPLICATION

This application is based on Provisional Application Serial No. 60/181,591 filed Feb. 10, 2000, which is incorporated herein by reference.

FIELD OF THE INVENTION

The present invention relates generally to semiconductor memory devices.

BACKGROUND OF THE INVENTION

Non-volatile memory devices are currently in widespread use in electronic components that require the retention of information when electrical power is terminated. Non-volatile memory devices include read only memory (ROM), programmable read only memory (PROM), erasable programmable read only memory (EPROM), and electrically erasable programmable read only memory (EEPROM) devices. EEPROM devices differ from other nonvolatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value.

The threshold level of the enhancement transistor controls current flow through the transistor by application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state. This feature is identical to FET operation, except the floating gate in an EEPROM FET alters the threshold voltage dependent upon the presence of charge within the floating gate.

One type of EEPROM device utilizes a polycrystalline silicon or metal layer for the floating-gate electrode. Electrons are transferred to the floating-gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating-gate by an overlying control-gate electrode.

The EEPROM device is programmed by applying a high positive voltage to the control-gate electrode, and a lower positive voltage to the drain region, which transfers electrons from the channel region to the floating-gate electrode. The EEPROM device is erased by grounding the control-gate electrode and applying a high positive voltage through either the source or drain region of the enhancement transistor. Under erase voltage conditions, electrons are removed from the floating-gate electrode and transferred into either the source or drain regions in the semiconductor substrate.

Another type of EEPROM device utilizes an oxide-nitride-oxide (ONO) layer for the fabrication of the floating-gate electrode. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer.

Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Non-volatile memory designers have taken advantage of the localized nature of electron storage within a silicon nitride layer and have designed memory circuits that utilize two regions of stored charge within the ONO layer. This type of non-volatile memory device is known as a two-bit EEPROM.

The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions. The structure and operation of this type of memory device is described in a PCT application having the International Publication Number of WO/07000 entitled "TWO BIT NON-VOLATILE ELECTRICALLY ERASABLE AND PROGRAMMABLE SEMICONDUCTOR MEMORY CELL UTILIZING ASYMMETRICAL CHARGE TRAPPING", the contents of which are fully incorporated herein by reference.

The present invention is directed to the type of memory cell described above that utilize ONO to achieve two-bit operation. Programming of such cells generates significant electrical fields that influence programming of adjacent cells. This can alter the programmed state of a cell adjacent to the one being programmed, or can draw charge to the center of the ONO layer between the opposing bit storage regions where it is extremely difficult, if not impossible, to remove. Therefore, a desirable two-bit ONO memory device would have improved isolation between bits stored on the same device.

SUMMARY OF THE INVENTION

According to an aspect of the invention, a process is provided for making an array of two-bit floating gate transistors for a semiconductor memory device, comprising:

forming the array of two-bit floating gate transistors having ONO floating gates partially overlying parallel rows of bit-line oxide; and forming isolation spacers between the parallel rows of bit-line oxide beneath the ONO floating gates that create an isolation ridge without dividing the ONO floating gates.

According to a further aspect of the invention, a process is provided for making an array of two-bit floating gate transistors for a semiconductor memory device, comprising:

providing a silicon wafer substrate having parallel rows of bit-line oxide;

depositing an isolation layer on the substrate;

forming isolation spacers centered between the parallel rows of bit-line oxide by forming a first mask on the isolation layer, removing the first mask except leaving portions of the first mask over areas of the isolation layer where the isolation spacers are to be formed, removing the isolation layer from areas where the first mask is removed and leaving the isolation layer beneath the portions of the first mask that remain, and removing the portions of the first mask and leaving the isolation spacers on the silicon wafer substrate;

depositing a floating gate ONO layer on the silicon wafer substrate, the floating gate ONO layer comprising a first silicon dioxide layer, a silicon nitride layer on the first silicon dioxide layer, and a second silicon dioxide layer on the silicon nitride layer; and, forming adjacent isolated floating gates from the floating gate ONO layer by forming a second mask on the floating gate ONO layer, forming openings in the second mask layer centered upon the rows of bit-line oxide, and removing the second silicon dioxide layer and the silicon nitride layer within the openings.

DETAILED DESCRIPTION

Figure 1:
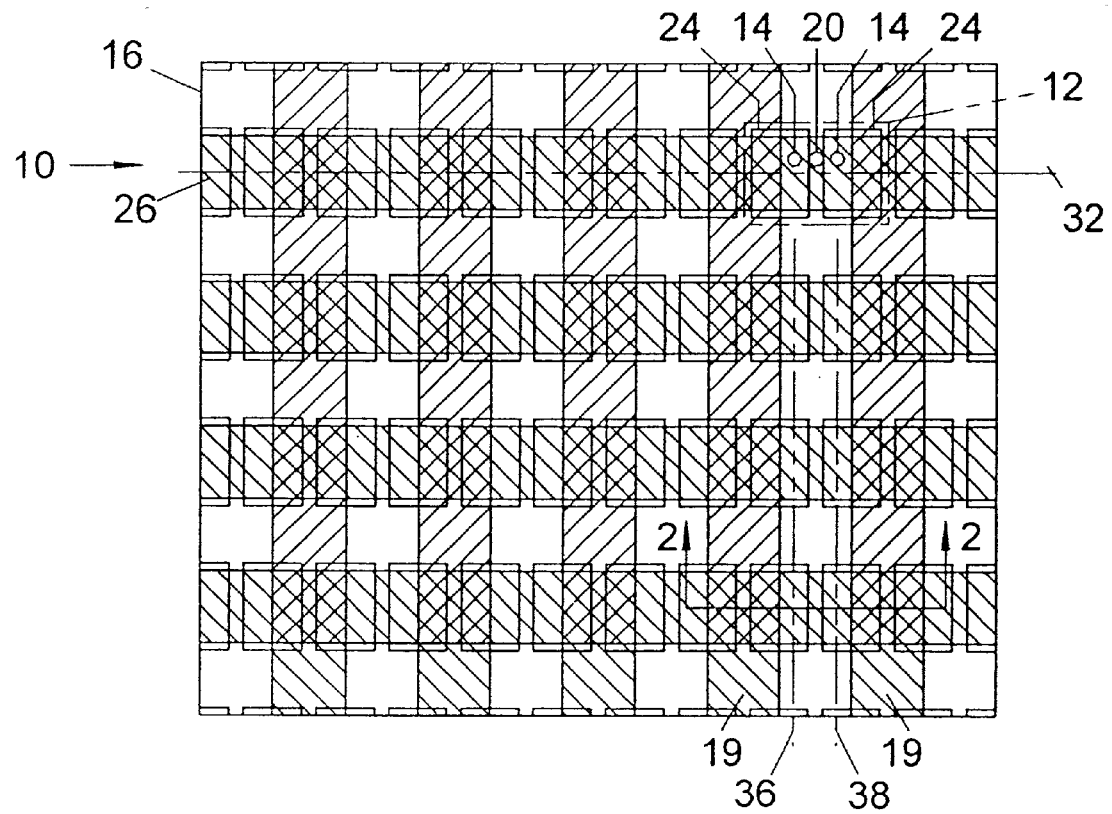
FIG. 1 illustrates, in cross-section, a portion of a semiconductor substrate coining a dual ONO floating-gate two-bit transistor in accordance with the invention.

Various aspects of the invention are presented in FIGS. 1–8, which are not drawn to scale, and wherein like components in the numerous views are numbered alike. Referring now to FIG. 1 a portion of a ROM memory device 10 showing, in schematic plan view, an array of floating-gate transistors 12 (a single transistor 12 indicated in phantom) formed upon a single crystal silicon substrate 16. The columns of the array are defined by right and left bit-lines 36 and 38 between parallel rows of bit-line oxide 19. The bit-lines 36 and 38 comprise a multitude of doped source/drain regions 14 disposed beneath floating gates 24 on opposite sides of a doped common channel region 20. The source/drain region 14 and channel regions 20 are doped with N type and P type atoms in a manner well known in the art that need not be explained in detail here, other than to say that the doping creates a multitude of transistors suitable for use in a ROM. Each floating-gate transistor 12 comprises such regions.

The rows of the matrix are comprised of wordlines 32 formed by parallel control gates 26, which extend transversely or perpendicular to the direction of the bit-lines 36 and 38. The floating-gates 24 are located beneath the control gates 26 (i.e., along the wordlines 32). As will be explained in detail below, each floating-gate transistor 12 is accessed by addressing the appropriate wordline 32 and bit-lines 36 and 38.

Figure 2:
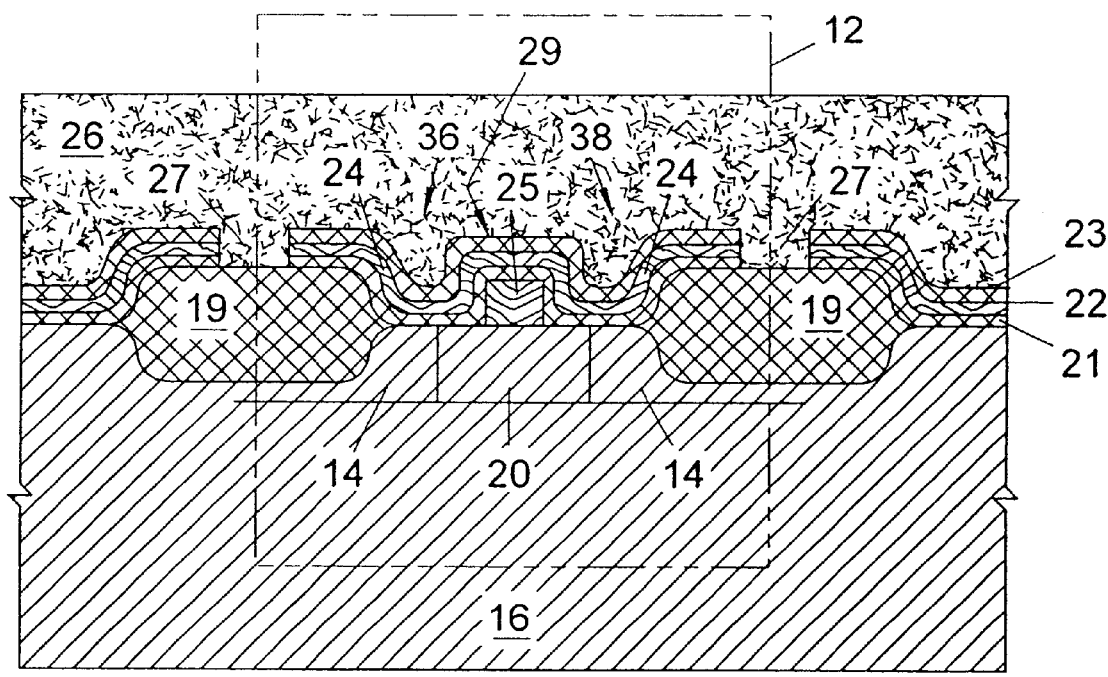
FIG. 2 illustrates, in plan, a portion of a semiconductor substrate containing a dual ONO floating-gate two-bit transistor in accordance with the invention.

Referring now to FIG. 2, a cross sectional view of the ROM memory device 10 is presented taken along line 2—2 of FIG. 1. Elements previously discussed in relation to FIG. 1 are presented in FIG. 2. The channel region 20 is located between each pair of adjacent source/drain regions 14 just below the floating gates 24. As will be explained in greater detail below in connection with the operation of the floating-gate transistor 12, the channel region 20 is the area through which charge carriers (electrons or holes) travel in response to a potential applied to or across a pair of source/drain regions 14. The floating gates 24 are comprised of an ONO layer, and are adjacent or between the bit-line oxide 19 rows. The floating gates 24 may partially overlay the bit-line oxide 19, the channel 20, and/or the source/drain regions 14. The ONO layer comprises a first silicon dioxide layer 21 on the substrate 16, a silicon nitride layer 22 on the first silicon dioxide layer 21, and a second silicon dioxide layer 23 on the silicon nitride layer 22. According to an aspect of the invention, each transistor 12 comprises dual floating gates 24 separated by an isolation spacer 25. The floating gates 24 are actually continuous and extend up and over the isolation spacer 25. The isolation spacer significantly increases resistance to movement of electrons between the left floating gate 24 and the right floating gate 24 without actually severing the two gates. Floating gates of adjacent transistors 12 are separated by isolation openings 27 formed in the ONO layer.

It should also be noted that the dual floating-gate transistor 12 of the present invention is a symmetrical device. Therefore, the use of the terms "source" and "drain," as they are commonly used with conventional transistor devices, may be confusing. For example, each dual floating-gate transistor 12 comprises a pair of adjacent source/drain regions 14. During program, erase and read functions, one of these two source/drain regions 14 will serve as a source, while the other will serve as a drain.

In conventional transistor terminology, electrons travel from the source to the drain. Which source/drain region 14 functions as a source, and which serves as a drain, depends on the function being performed and on the floating-gate 24 being addressed (i.e., programmed, erased or read).

To avoid confusion, the various components may be referred to as "left" and "right" in the orientation as they appear in the drawings. For example, the source/drain regions 14 and the floating gate 24 corresponding to the left bit-line 36 will be referred to as the left source/drain region 14 and the left floating gate 24. The source/drain region 14 and the floating gate 24 corresponding to the right bit-line 38 will be designated as the right source/drain region 14 and the right floating gate 24. In doing so, it is not intended to limit the invention to any particular orientation, since the terms left and right are used merely to indicate relative position.

Operation of Device

The dual floating-gate transistor 12 of the present invention is capable of storing two bits of information, one bit in each floating-gate 24. Programming and reading each of the floating-gates 24, however, requires asymmetrical operation. In particular, programming in one direction (e.g., left to right) will program the right floating-gate 24. Programming in the other direction (e.g., right to left) will program the left floating-gate 24. Likewise, which floating-gate 24 is read depends on which direction the read operation is performed. Which of a pair of source/drain regions 14 is utilized as a "source" and which is utilized as a "drain" determines the direction of programming and reading.

To program the right floating-gate 24, the left source/drain 14 is grounded and program voltages are applied to the control gate 26 and the right source/drain 38 to create lateral and vertical electric fields. Under conventional transistor terminology, the left source/drain 14 is considered the "source" and the right source/drain 14 is considered the "drain." The lateral electric field causes electric charge (i.e., electrons) to propagate across the channel region 20 from the left source/drain 14 towards the right source/drain 14. Once the charge gains enough energy and encounters a sufficiently strong vertical field, the charge is either injected (Channel Hot Electron injection) or tunnels (Fowler-Nordheim tunneling) from channel region 20 across the first silicon dioxide layer 21 and into the silicon nitride layer 22 of the right floating-gate 24. Suitable "program voltages" to accomplish this are well known in the art.

A similar method is used to program the left floating-gate 24. However, the "source" and the "drain" are reversed. In other words, the right source/drain 14 is grounded and program voltages are applied to the control gate 26 and the left source/drain 14. Under conventional transistor terminology, the source/drain 14 is considered the "drain" and the right source/drain 14 is considered the "source." The lateral and vertical fields generated cause electric charge to move towards the left source/drain 14 and subsequently into the left floating-gate 24.

The floating gates 24 are read in the direction opposite to programming. For example, the right floating-gate 24 is read by grounding the right source/drain and applying read voltages to the control gate 26 and the left source/drain 14. Under conventional transistor terminology, the left source/drain 14 is considered the "drain" and the right source/drain 14 is considered the "source." A programmed floating gate 24 has a higher threshold voltage than an unprogrammed floating gate 24. The voltage applied to the control gate 26 for reading is greater than the threshold voltage of an unprogrammed floating gate, but less than the threshold voltage of a programmed transistor 12.

When reading a particular floating gate 24, in this case the right one, a transistor 12 having a programmed floating gate 24 conducts current, and a transistor 12 having an unprogrammed floating gate 24 does not conduct current. This property reflects the 0 and 1 bit states, respectively. In this example, the right floating gate 24 determines the threshold voltage, thus corresponding to the right bit in transistor 12. Suitable "read voltages" are well known in the art.

A similar method is used to read the left floating-gate 24. However, the "source" and the "drain" are reversed. In other words, the left source/drain 14 is grounded and read voltages are applied to the right source/drain 14 and the control gate 26. Under conventional transistor terminology, the left source/drain 14 is considered the "source" and the right source/drain is considered the "drain." As described above, the flow of current through the dual floating-gate transistor 12 depends on whether the left floating-gate 24 is programmed or not. In this example, the left floating gate 24 determines the threshold voltage, thus corresponding to the left bit in transistor 12.

It should be understood that the dual floating-gate transistor 12 of the present invention permits the status of one floating-gate 24 to be determined irrespective of the status of the other floating-gate 24. In other words, the programmed state of one of the floating-gates 24 will not effect the ability to read the other floating-gate 24.

The dual floating-gate transistor 12 is typically erased by simultaneously applying erase voltages to the source/drain regions 14 and the control gate 26 that generate electric fields that pull the trapped electrons out of the silicon nitride layer 22 into the corresponding source/drain. For example, a negative voltage may be applied to the control gate 26 and a positive voltage to the source/drain regions 14 so as to cause electron tunneling to occur from the floating-gates 24 to the source/drain regions 14. Suitable erase voltages are well known in the art.

Programming, reading, and erasing the bits in the dual-bit transistor 12 is performed using support logic circuits disposed outside of the memory array. The configuration of the support logic circuits depends upon the desired parameters for a particular application according to circuit design and fabrication practices known in the art.

Process of Fabrication

According to a further aspect of the invention, a process for making an array of two-bit floating gate transistors 12 for a semiconductor memory device 10 is provided. Still referring to FIGS. 1 and 2, an array of two-bit floating gate transistors 12 is formed having floating gates 24 partially overlying parallel rows of bit-line oxide 19. Isolation spacers 25 are formed between the parallel rows of bit-line oxide 19 that create an isolation ridge 29 without dividing the ONO floating gates 24. Isolation openings 27 may also be formed centered over the rows of bit-line oxide 19 that divide the floating gates 24. According to a further aspect of the invention, the semiconductor memory device 10 may be incorporated into an electronic device, such as a computer, without limitation.

Figure 3:
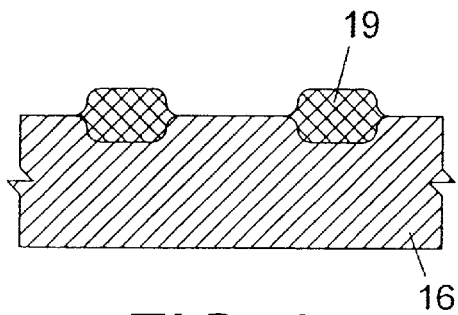
FIG. 3 illustrates a cross-sectional view of a stage of a process for making a two bit memory device according to an aspect of the invention.
Figure 4:
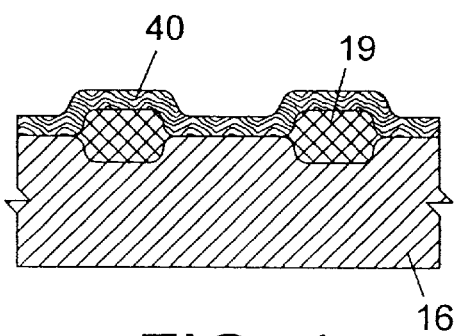
FIG. 4 illustrates a cross-sectional view of a subsequent stage of the process.

Referring now to FIGS. 3–8, a process for making a semiconductor device 10 according to a further aspect of the invention is presented. Referring now specifically to FIG. 3, a silicon wafer substrate 16 is provided having parallel rows of bit-line oxide 19. Referring now to FIG. 4, an isolation layer 40 is deposited on the substrate 16. The isolation layer 40 is a material having dielectric characteristics, such as silicon nitride.

Figure 5:
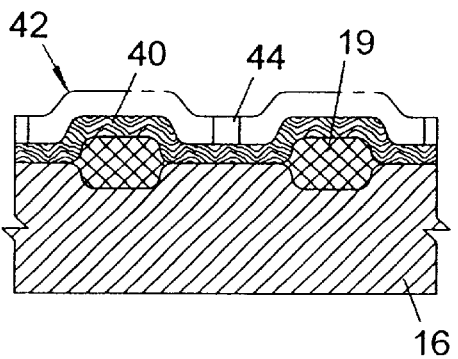
FIG. 5 illustrates a cross-sectional view of a subsequent stage of the process.

The next step in the process is to form isolation spacers 25 centered between the parallel rows of bit-line oxide 19. Referring now to FIG. 5, a first mask 42 (shown in phantom) is formed on the isolation layer 40. The first mask 42 is then removed except portions 44 of the first mask 42 are left over areas of the isolation layer 40 where the isolation spacers 25 are to be formed. Suitable masking techniques and materials are known in art, for example photolithography of photoresist and removal of unwanted photoresist by solvents. It is not intended to limit the invention to any particular masking technique or material.

Figure 6:
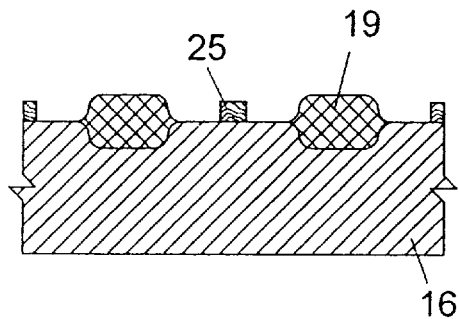
FIG. 6 illustrates a cross-sectional view of a subsequent stage of the process.

Referring now to FIG. 6, the isolation layer 40 is then removed from areas where the first mask was removed using dry or wet etching processes known in the art. The remaining portions 44 of the first mask 42 shields the isolation layer 40, thus leaving the isolation layer 40 beneath the portions 44 of the first mask 42 that remain. The remaining portions 44 of the first mask 42 are removed, thus leaving the isolation spacers 25 on the silicon wafer substrate 16.

Figure 7:
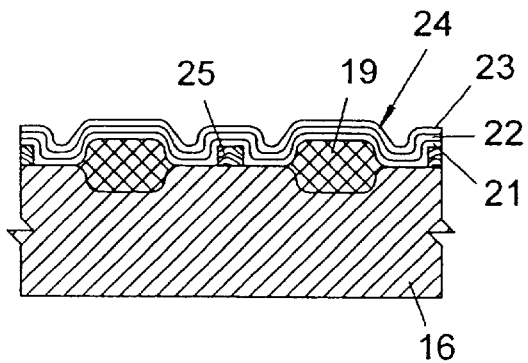
FIG. 7 illustrates a cross-sectional view of a subsequent stage of the process; and, FIG. 8 illustrates a cross-sectional view of a subsequent stage of the process.

Referring now to FIG. 7, the floating gate ONO layer 24 is then deposited on the silicon wafer substrate 16. The floating gate ONO layer 24 comprises the first silicon dioxide layer 21, the silicon nitride layer 22 on the first silicon dioxide layer 21, and the second silicon dioxide layer 23 on the silicon nitride layer 22. Suitable chemical vapor deposition processes for ONO deposition are known in the art.

Figure 8:
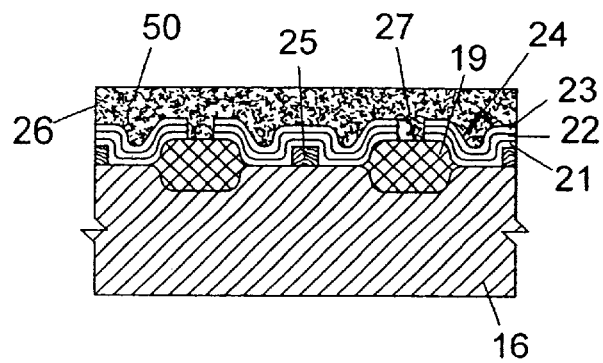

Referring now to FIG. 8, adjacent isolated floating gates 24 corresponding to adjacent dual bit floating gate transistors 12 are formed from the floating gate ONO layer 24 by forming a second mask (not shown) on the floating gate ONO layer 24, forming openings in the second mask layer centered upon the rows of bit-line oxide 19, and removing the second silicon dioxide layer 23 and the silicon nitride layer 22 within the openings, thus forming the isolation openings 27. A floating gate layer 50, for example polysilicon, is then deposited to form the control gate 26.

The isolation spacers 25 may be formed as continuous ridges and the isolation openings 27 may be formed as trenches. Alternatively, the isolation spacers 25 may be formed as discrete ridge islands and the isolation openings 27 may be formed as discrete openings. The form of the isolation spacers 25 and the isolation openings 27 is determined by the first and second masks, respectively.

A process for making a semiconductor device 10 having an array of two-bit floating gate transistors 12 is also provided. A silicon wafer substrate 16 is provided having parallel rows of bit-line oxide 19. A multitude of isolated ONO floating gates 24 are formed, arranged such that each two-bit floating gate transistor 12 has two of the isolated floating gates 24, one for each bit, using the processes described in relation to FIGS. 3–8.

According to a further aspect of the invention, a semiconductor memory device 10 is provided made by any of the processes of the invention. According to a further aspect of the invention, a computer is provided comprising the semiconductor memory device 10 made by the processes of the invention. The semiconductor memory device 10 may be a flash EEPROM.

Although the invention has been described and illustrated with reference to specific illustrative embodiments thereof, it is not intended that the invention be limited to those illustrative embodiments. Those skilled in the art will recognize that variations and modifications can be made without departing from the true scope and spirit of the invention as defined by the claims that follow. It is therefore intended to include within the invention all such variations and modifications as fall within the scope of the appended claims and equivalents thereof.

What is claimed is:

1. A process for making an array of two-bit floating gate transistors for a semiconductor memory device, comprising:
    forming said array of two-bit floating gate transistors having ONO floating gates between parallel rows of bit-line oxide; and
    forming isolation spacers between said parallel rows of bit-line oxide beneath said ONO floating gates that create an isolation ridge without dividing said ONO floating gates.

2. The process of claim 1, further comprising forming isolation openings centered over said rows of bit-line oxide that divide said floating gates.

3. A process for making an array of two-bit floating gate transistors for a semiconductor memory device, comprising:
    providing a silicon wafer substrate having parallel rows of bit-line oxide;
    depositing an isolation layer on said substrate;
    forming isolation spacers centered between said parallel rows of bit-line oxide by
        forming a first mask on said isolation layer,
        removing said first mask except leaving portions of said first mask over areas of said isolation layer where said isolation spacers are to be formed,
        removing said isolation layer from areas where said first mask is removed and leaving said isolation layer beneath said portions of said first mask that remain, and
        removing said portions of said first mask and leaving said isolation spacers on said silicon wafer substrate;
    depositing a floating gate ONO layer on said silicon wafer substrate, said floating gate ONO layer comprising a first silicon dioxide layer, a silicon nitride layer on said first silicon dioxide layer, and a second silicon dioxide layer on said silicon nitride layer; and,
    forming adjacent isolated floating gates from said floating gate ONO layer by
        forming a second mask on said floating gate ONO layer,
        forming openings in said second mask layer centered upon said rows of bit-line oxide,
        removing said second silicon dioxide layer and said silicon nitride layer within said openings.

4. The process of claim 3, wherein said isolation layer is silicon nitride.

5. The process of claim 3, further comprising the step of depositing a polysilicon control gate layer.

6. The process of claim 3, wherein said openings comprise rows of trenches parallel to said rows of bit-line oxide.

7. The process of claim 3, wherein said openings are arranged in parallel rows that are parallel to said rows of bit-line oxide.

8. A semiconductor memory device made by the process of claim 3.

9. The semiconductor memory device of claim 8 that is a flash EEPROM.

10. A process for making a semiconductor device having an array of two-bit floating gate transistors, comprising:
    providing a silicon wafer substrate having parallel rows of bit-line oxide; and,
    forming a multitude of adjacent isolated ONO floating gates arranged such that each said two-bit floating gate transistor has two of said isolated floating gates, one for each bit, comprising
        depositing an isolation layer on said substrate,
        forming isolation spacers centered between said parallel rows of bit-line oxide by
            forming a first mask on said isolation layer,
            removing said first mask except leaving portions of said first mask over areas of said isolation layer where said isolation spacers are to be formed,
            removing said isolation layer from areas where said first mask is removed and leaving said isolation layer beneath said portions of said first mask that remain, and
            removing said portions of said first mask and leaving said isolation spacers on said silicon wafer substrate,
        depositing a floating gate ONO layer on said silicon wafer substrate, said floating gate ONO layer comprising a first silicon dioxide layer, a silicon nitride layer on said first silicon dioxide layer, and a second silicon dioxide layer on said silicon nitride layer, forming said adjacent isolated ONO floating gates from said floating gate ONO layer by
- forming a second mask on said floating gate ONO layer,
- forming openings in said second mask layer centered upon said rows of bit-line oxide,
- removing said second silicon dioxide layer and said silicon nitride layer within said openings.

11. The process of claim 10, wherein said isolation layer is silicon nitride.

12. The process of claim 10, further comprising the step of depositing a polysilicon control gate layer.

13. A semiconductor memory device made by the process of claim 10.

14. The semiconductor memory device of claim 13 that is a flash EEPROM.

* * * * *